United States Patent [19]

Doyle et al.

[11] Patent Number: 4,824,389
[45] Date of Patent: Apr. 25, 1989

[54] SOCKET FOR ELECTRONIC COMPONENT

[75] Inventors: John T. Doyle, Winchester, Mass.; Richard D. Wiciel, Kingston, N.H.

[73] Assignee: Precision Connector Designs, Inc., Peabody, Mass.

[21] Appl. No.: 185,528

[22] Filed: Apr. 26, 1988

[51] Int. Cl.4 ............................................... H01R 9/09
[52] U.S. Cl. ........................................ 439/269; 439/72
[58] Field of Search .......................... 439/68, 266–270, 439/70–73, 330, 525, 526, 259–265

[56] References Cited

U.S. PATENT DOCUMENTS

| 3,883,207 | 5/1975 | Tomkiewicz | 439/264 |
| 4,461,525 | 7/1984 | Griffin . | |
| 4,491,377 | 1/1985 | Pfaff . | |
| 4,715,823 | 12/1987 | Ezura et al. | 439/269 |
| 4,739,257 | 4/1988 | Jenson et al. | 439/71 |
| 4,750,890 | 6/1988 | Dube et al. | 439/70 |

FOREIGN PATENT DOCUMENTS 2039160 7/1980 United Kingdom ................ 439/264

Primary Examiner—Gary F. Paumen

[57] ABSTRACT

A socket for an electronic component having conductors for making electrical connection, the socket comprising a base member, a plurality of resilient contacts that are mounted on the base member at contact support portions and have free contact ends for engaging the conductors of the component, the contacts also having inwardly-directed first cam surfaces, and a component support that is slidably mounted with respect to the base member and contacts along an axis and has outwardly directed second cam surfaces that act to displace the contacts transversely to the axis as the component support is moved along the axis.

5 Claims, 1 Drawing Sheet

U.S. Patent  Apr. 25, 1989  4,824,389

SOCKET FOR ELECTRONIC COMPONENT

FIELD OF THE INVENTION

The invention relates to sockets, in particular to sockets especially suitable for small-outline integrated circuits.

BACKGROUND OF THE INVENTION

Sockets for integrated circuits are known.

A burn-in/test socket that is available from Wells Electronics, Inc. under the 717 SOIC trade designation and is described in U.S. Pat. No. 4,461,525 has sidewalls that swing open to displace contacts outward while integrated circuit (IC) leads are moved into position; as the sidewalls are swung closed, the contacts move inward and engage the leads.

Pfaff U.S. Pat. No. 4,491,377 discloses a socket for leadless chip carriers. The socket employs a spreader that has cam surfaces that interact with mating cam surfaces on contacts to temporarily displace contacts outward while the leadless chip carrier is inserted. As the spreader is released, the contacts move inward to engage conductors on the carrier.

SUMMARY OF THE INVENTION

It has been discovered that an electronic component can desirably be engaged by contacts mounted on a base member of a socket by employing a component support that is slidably mounted with respect to the base member and has cam surfaces that interact with cam surfaces on the contacts to displace the contacts. When the component support is moved toward the base member, the contacts move outward, permitting the electronic component to be placed on the support. As the support is then moved away from the base member (e.g., by spring force) the contacts move both inward and, with respect to the support, in the direction of sliding.

In preferred embodiments the component has two rows of leads that are engaged by two rows of contacts on the socket; the contacts have hooked ends that overhang and engage the leads of the component; the cam surfaces are curved so as to cause contact force between the hooked end and the lead generally along the axis of sliding and outward movement of the contact ends when the support is at its end of travel toward the base member; and the support has dividers that provide spaces for respective contacts and leads between them.

Other advantages and features of the invention will be apparent from the following description of the preferred embodiment thereof and from the claims.

DESCRIPTION OF THE PREFERRED EMBODIMENT

The preferred embodiment will now be described.

DRAWINGS

STRUCTURE

Figure 1:
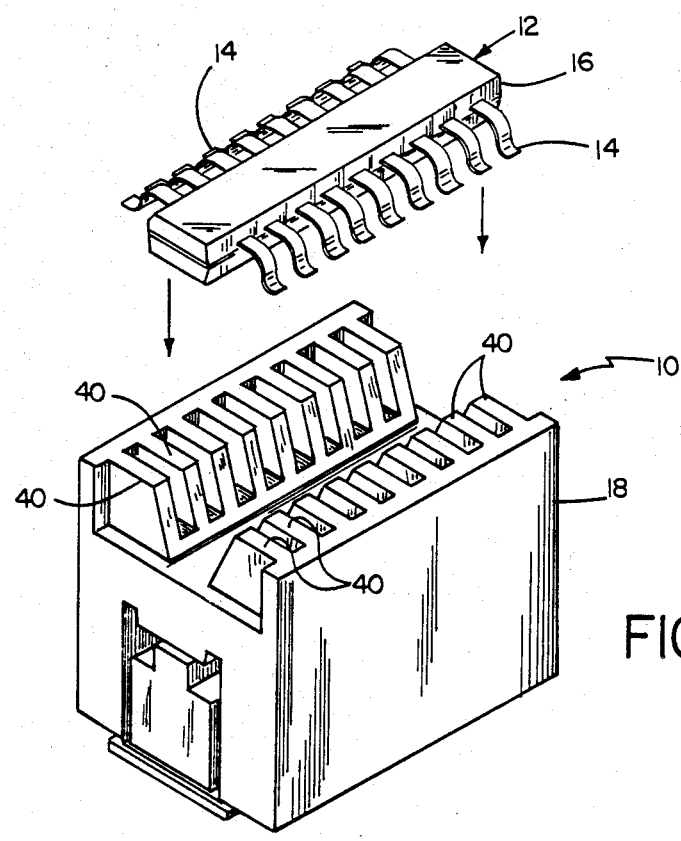
FIG. 1 is a perspective view of an electronic component and a socket for releasably engaging the component according to the invention.
Figure 2:
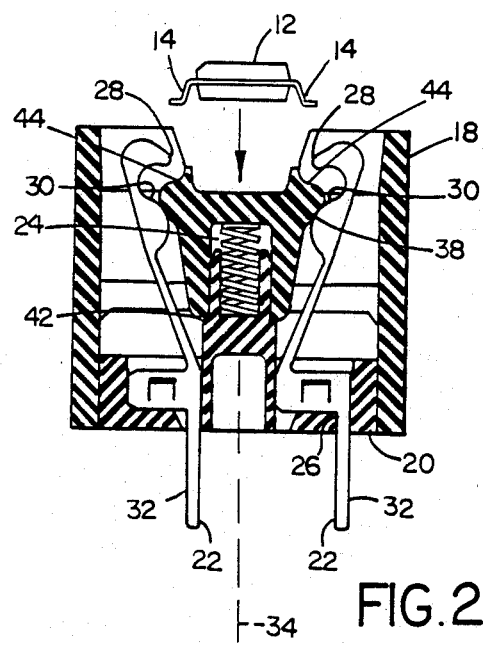
FIG. 2 is a vertical sectional view of the FIG. 1 socket shown in an open position prior to engaging an electronic component.
Figure 3:
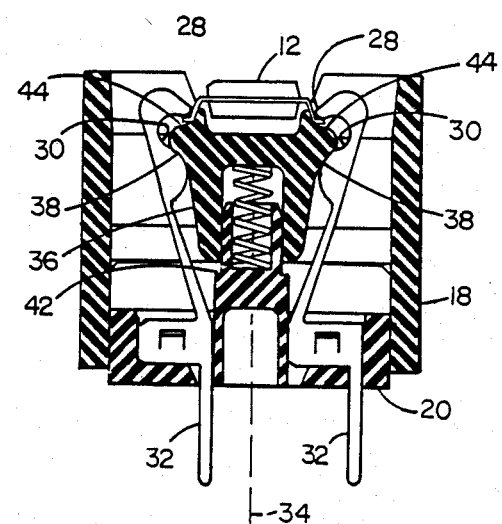
FIG. 3 is a vertical sectional view showing the component engaged by the socket.

Referring to the figures, there is shown socket 10 for receiving electronic component 12, a small-outline integrated circuit. Component 12 has two rows of leads 14 that extend outward from the sides of body 16. Socket 10 includes component support 18, base member 20, contacts 22, and two springs 24. Component support 18 and base member 20 are made of insulating material. Contacts 22 are mounted on base member 20 at contact support portions 26 and have hooked ends 28 and curved cam surfaces 30. As is shown in FIGS. 2 and 3, there are two types of contacts 22: one with lead 32 connected to contact portion 26 near the center of the socket and one with lead 32 outward from the center to provide staggering of leads 32. Component support 18 is slidably mounted along vertical axis 34 with respect to base member 20 and has a central portion 36 on which component 12 is supported. Central portion 36 has outwardly directed cam surfaces 38 for interacting with contact cam surfaces 30. Component support 18 also has upwardly directed dividers 40 that define spaces between them for receiving leads 14 and respective hooked contact ends 28. Downward travel of component support 18 with respect to base member 20 is limited by lip 42 of base member 20. Upward travel of component support 18 is limited by interference of hooked ends 28 of contacts 22 with ledges 44 of central portion 36.

OPERATION

In operation, component support 18 is depressed to the position shown in FIG. 2, causing hooked ends 28 of contacts 22 to be displaced outwardly owing to the interaction of cam surfaces 30 and 38. Component 12 is then lowered into position with its leads 14 traveling in the respective spaces between dividers 40 until the bottom horizontal portions of leads 14 rest on ledges 44. Component support 18 is then released and is biased upward by springs 24. Owing to the curved nature of cam surfaces 30, 38, the initial travel of hooked ends 28 with respect to ledges 44 is substantially transverse to axis 34. As ledges 44 and leads 14 thereon are about to contact hooked ends 28, the travel of leads 14 with respect to hooked ends 28 is substantially parallel to axis 34 so that ledges 44 tend to push leads 14 up against hooked ends 28.

Component socket 10 provides sufficient force for reliable connection but not so much as to bend fragile leads 14. The leads are supported by ledges 44, and dividers 40 protect the leads from damage. Because component support 18 need only be depressed in order to open the contacts to receive a component 12, automatic loading equipment can be used for loading component 12. The compact size of socket 10 permits placing a large number of sockets on a board. The design also provides for necessary deflection of contact 22 without overstressing.

OTHER EMBODIMENTS

Other embodiments of the invention are within the scope of the following claims.

What is claimed is:

1. A socket for an electronic component having conductors for making electrical connection with external circuitry, said socket comprising a base member, a plurality of resilient contacts that are mounted on said base member at contact support portions and have free contact ends for engaging said conductors of said component, said contacts also having inwardly-directed first cam surfaces, a component support that is slidably mounted with respect to said base member and contacts along an axis and has outwardly-directed second cam surfaces that act to displace said contacts transversely to said axis as said component support is moved along said axis, said component support having conductor support surfaces for supporting said conductors of said component, said contacts extending, between said first cam surfaces and said contact ends, outwardly of said support member and then inwardly toward said conductor support surfaces so as to engage said conductors when said conductors are sandwiched between said contact ends and said conductor support surfaces, and means to bias said base member with respect to said support to bias said contact ends toward said conductor support surfaces.

2. The socket of claim 1 wherein said means to bias comprises a spring to bias said component support away from said base member along said axis.

3. The socket of claim 1 wherein said electronic component has two rows of said conductors along two sides of the component, and wherein there are two rows of said contacts.

4. The socket of claim 1 wherein said first cam surfaces and said second cam surfaces are curved so as to cause contact force between the contact ends and the conductors generally along the axis of sliding and cause outward movement of the contact ends when the support is at its end of travel toward the base member.

5. The socket of claim 1 wherein said conductors are leads that extend outward from the sides of said component, and wherein said support has dividers that provide spaces for respective contacts and leads between them.

* * * * *